United States Patent
Kwon et al.

(10) Patent No.: US 9,091,740 B2
(45) Date of Patent: Jul. 28, 2015

(54) APPARATUS AND METHOD FOR SYNCHRONIZING CLOCKS BETWEEN DEVICES OF MAGNETIC RESONANCE IMAGING (MRI) SYSTEM

(75) Inventors: Young-cheol Kwon, Osan-si (KR); Hyug-rae Cho, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 13/540,966

(22) Filed: Jul. 3, 2012

(65) Prior Publication Data

US 2013/0127465 A1    May 23, 2013

(30) Foreign Application Priority Data

Nov. 17, 2011    (KR) .................. 10-2011-0120321

(51) Int. Cl.
*G01V 3/00*    (2006.01)
*G01R 33/36*    (2006.01)

(52) U.S. Cl.
CPC ........ *G01R 33/3692* (2013.01); *G01R 33/3621* (2013.01)

(58) Field of Classification Search
CPC .................. G01R 33/3692; G01R 33/3621
USPC ..................... 324/300–322; 600/407–465
See application file for complete search history.

(56) References Cited

U.S. PATENT DOCUMENTS

| | | | |
|---|---|---|---|
| 5,529,068 A * | 6/1996 | Hoenninger et al. | 600/413 |
| 6,310,478 B1 * | 10/2001 | Heid | 324/309 |
| 7,123,009 B1 | 10/2006 | Scott | |
| 7,323,876 B2 * | 1/2008 | Den Boef | 324/322 |
| 7,391,214 B2 * | 6/2008 | Adachi | 324/318 |
| 7,560,933 B2 * | 7/2009 | Yoshizawa | 324/322 |
| 7,818,359 B2 * | 10/2010 | Yoshizawa | 708/290 |
| 8,402,300 B2 * | 3/2013 | Baumgartl et al. | 713/400 |
| 8,502,540 B2 * | 8/2013 | Nakanishi et al. | 324/322 |
| 8,575,935 B2 * | 11/2013 | Roeven | 324/322 |
| 8,704,522 B2 * | 4/2014 | Akita et al. | 324/322 |
| 2009/0018442 A1 * | 1/2009 | Miller et al. | 600/437 |
| 2009/0322335 A1 * | 12/2009 | Adachi et al. | 324/318 |
| 2010/0117649 A1 * | 5/2010 | Nakanishi et al. | 324/318 |
| 2010/0253331 A1 | 10/2010 | Griswold et al. | |
| 2010/0259261 A1 * | 10/2010 | Saes et al. | 324/309 |

FOREIGN PATENT DOCUMENTS

CN    101667906    * 3/2010    ............... H04L 7/00

(Continued)

OTHER PUBLICATIONS

Notice of Allowance issued Dec. 27, 2012 by the Korean Intellectual Property Office, in corresponding Korean Patent Application No. 10-2011-0120321.

(Continued)

*Primary Examiner* — Dixomara Vargas
(74) *Attorney, Agent, or Firm* — Sughrue Mion, PLLC

(57) ABSTRACT

A method of synchronizing clocks between a central controlling unit and a radio frequency (RF) coil which are wirelessly connected to each other in a magnetic resonance imaging (MRI) system, which includes receiving a first clock from the central controlling unit, synchronizing a second clock of the RF coil with a received first clock, and discontinuing the receiving of the first clock from the central controlling unit when the second clock is synchronized with the first clock.

24 Claims, 4 Drawing Sheets

(56) References Cited

FOREIGN PATENT DOCUMENTS

| | | |
|---|---|---|
| JP | 2010-29644 A | 2/2010 |
| JP | 2010-115256 A | 5/2010 |
| JP | 2011-98100 A | 5/2011 |
| JP | 2011-152227 A | 8/2011 |
| WO | 2004/089211 A2 | 10/2004 |

OTHER PUBLICATIONS

Communication issued Feb. 28, 2013 by the European Patent Office in counterpart EP Application No. 12190550.

Communication dated Aug. 29, 2014 issued by the State Intellectual Property Office of the People's Republic of China in counterpart Chinese Patent Application No. 201210363997.8.

\* cited by examiner

APPARATUS AND METHOD FOR SYNCHRONIZING CLOCKS BETWEEN DEVICES OF MAGNETIC RESONANCE IMAGING (MRI) SYSTEM

CROSS-REFERENCE TO RELATED PATENT APPLICATION

This application claims priority from Korean Patent Application No. 10-2011-0120321, filed on Nov. 17, 2011, in the Korean Intellectual Property Office, the disclosure of which is incorporated herein in its entirety by reference.

BACKGROUND

1. Field

Apparatuses and methods consistent with exemplary embodiments relate to an apparatus and method for synchronizing clocks between a central controlling unit and a radio frequency (RF) coil in a magnetic resonance imaging (MRI) system.

2. Description of the Related Art

A magnetic resonance imaging (MRI) system is an apparatus for acquiring a tomographic image of an object to be examined by expressing an intensity of a radio frequency (RF) signal of a particular frequency, which is generated by a magnetic field of a particular intensity, as brightness.

A patient is examined in a cylindrical gantry in a shielded room in which an external RF signal is shielded. An RF coil in the gantry receives an image signal of a patient and transmits the received image signal to a central control unit.

Recently, research on wireless communications between an RF coil and a central controlling unit has been widely performed. For wireless communications between an RF coil and a central controlling unit, it is very important to synchronize clocks of the RF coil and the central controlling unit.

SUMMARY

Exemplary embodiments provide an apparatus and method for synchronizing clocks between a central controlling unit and a radio frequency (RF) coil.

Also, Exemplary embodiments provide an apparatus and method for synchronizing clocks between a central controlling unit and a radio frequency (RF) coil without influencing capturing of an image performed by a magnetic resonance imaging (MRI) system.

According to an exemplary embodiment, there is provided a method of synchronizing clocks between a central controlling unit and a radio frequency (RF) coil which are connected to each other in a magnetic resonance imaging (MRI) system. The method includes receiving a first clock from the central controlling unit, synchronizing a second clock of the RF coil with the received first clock, and discontinuing the receiving of the first clock from the central controlling unit when the second clock is synchronized with the first clock. The central controlling unit and the RF coil may be wirelessly connected.

The method may further include requesting the central controlling unit to discontinue transmission of the first clock.

The method may further include storing the second clock that is synchronized with the first clock.

The requesting to discontinue the transmission of the first clock may be performed before an RF excitation signal is generated in the MRI system.

The method may further include requesting the central controlling unit to delay generation of the RF excitation signal if the second clock is not synchronized with the first clock.

The receiving of the first clock from the central controlling unit may include receiving the first clock via a body coil connected by wire to the central controlling unit.

The receiving of the first clock from the central controlling unit may include decoupling the RF coil from the first clock before the first clock is received.

The method may further include providing the RF coil with the second clock synchronized with the first clock.

The synchronizing of the second clock of the RF coil with the received first clock may include matching a frequency of the second clock with a frequency of the first clock.

The synchronizing of the second clock of the RF coil with the received first clock may include obtaining a phase difference between the first clock and second clock, outputting a control voltage to control an oscillation frequency of a clock based on an obtained phase difference, and varying the second clock according to the control voltage, wherein the second clock includes a varied second clock that is fed back.

According to another exemplary embodiment, there is provided an apparatus for synchronizing clocks between a central controlling unit and a radio frequency (RF) coil which are connected to each other in a magnetic resonance imaging (MRI) system. The apparatus includes a receiving unit which receives a first clock from the central controlling unit and a synchronization unit which synchronizes a second clock of the RF coil with the received first clock, wherein the receiving unit discontinues the receiving of the first clock from the central controlling unit when the second clock is synchronized with the first clock. The central controlling unit and the RF coil may be wirelessly connected.

The apparatus may further include a request unit which requests the central controlling unit to discontinue transmission of the first clock.

The apparatus may further include a storage unit which stores the second clock that is synchronized with the first clock.

The request unit may request the central controlling unit to discontinue transmission of the first clock before an RF excitation signal is generated in the MRI system.

The request unit may request the central controlling unit to delay generation of the RF excitation signal if the second clock is not synchronized with the first clock.

The receiving unit may receive the first clock via a body coil connected to the central controlling unit. The body coil and the central controlling unit may be connected by wire.

The synchronization unit may further include a decoupling unit which decouples the RF coil from the first clock before the first clock is received.

The synchronization unit may further include a transmission unit which provides the RF coil with the second clock that has been synchronized with the first clock.

The synchronization unit may match a frequency of the second clock to a frequency of the first clock.

The synchronization unit may include a phase comparison unit which obtains a phase difference between the first clock and the second clock, a control voltage output unit which outputs a control voltage to control an oscillation frequency of a clock based on the obtained phase difference, and a numerical control oscillator which varies the second clock according to the control voltage, wherein the varied second clock is fed back to the phase comparison unit.

According to another exemplary embodiment, there is provided an apparatus for synchronizing clocks between a central controlling unit and a radio frequency (RF) coil which are connected to each other in a magnetic resonance imaging (MRI) system, which includes a transmission unit which transmits a reference clock to the RF coil and a control unit which controls the transmission unit to allow the reference clock to be transmitted before an RF excitation signal is generated in the MRI system. The central controlling unit and the RF coil may be wirelessly connected.

According to another exemplary embodiment, there is provided a method of synchronizing clocks between a central controlling unit and a radio frequency (RF) coil which are connected to each other in a magnetic resonance imaging (MRI) system, which includes transmitting a first clock to the RF coil, using the central controlling unit, synchronizing a second clock of the RF coil with a received first clock, using the RF coil, and discontinuing transmitting of the first clock, using the central controlling unit, when the second clock is synchronized with the first clock.

The method may further include transmitting a frame indicating completion of synchronization to the central controlling unit.

According to yet another exemplary embodiment, a program for executing the above-described synchronization methods may be recorded on a computer-readable recording medium.

According to another aspect of the present invention, an RF coil may include the above-described apparatuses.

BRIEF DESCRIPTION OF THE DRAWINGS

The above and other features will become more apparent by describing in detail exemplary embodiments thereof with reference to the attached drawings in which.

DETAILED DESCRIPTION

Figure 1:
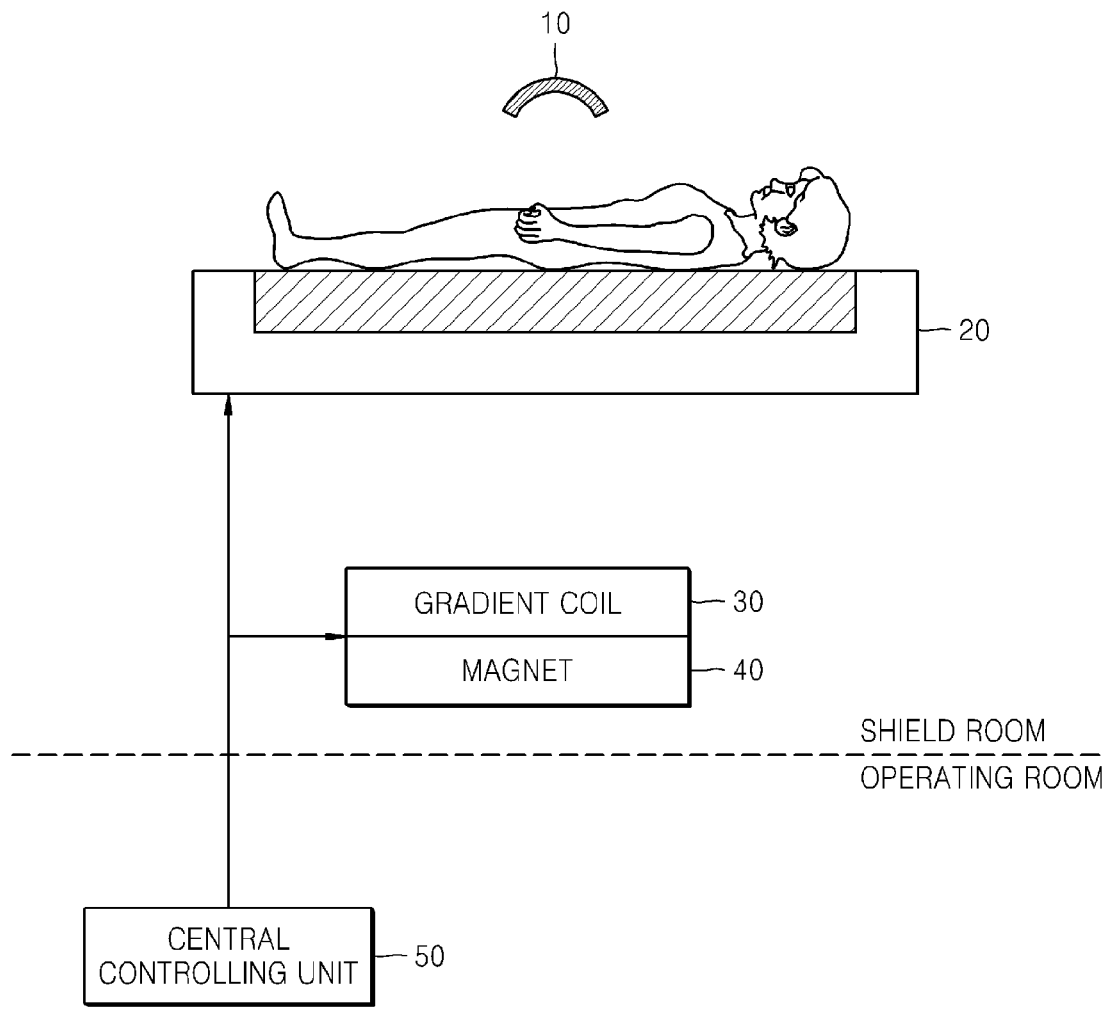
FIG. 1 is a view schematically illustrating a magnetic resonance imaging (MRI) system.

The attached drawings for illustrating exemplary embodiments are referred to in order to gain a sufficient understanding of the exemplary embodiment, the merits thereof, and the objectives accomplished by the implementation thereof. Hereinafter, exemplary embodiments will be described in detail with reference to the attached drawings. Like reference numerals in the drawings denote like elements.

Expressions such as "at least one of," when preceding a list of elements, modify the entire list of elements and do not modify the individual elements of the list.

When a part may "include" a certain constituent element, unless specified otherwise, it may not be construed to exclude another constituent element but may be construed to further include other constituent elements. The terms such as "~portion", "~unit", "~module", and "~block" stated in the specification may signify a unit to process at least one function or operation and the unit may be embodied by hardware such as a field-programmable gate array (FPGA) or an application-specific integrated circuit (ASIC), software, or a combination of hardware and software. Also, to embody exemplary embodiments, hardware, software, or a combination of hardware and software may be used instead of a programmed processor/controller. Accordingly, exemplary embodiments are not limited by a specific combination of hardware and software.

FIG. 1 illustrates a magnetic resonance imaging (MRI) system. Referring to FIG. 1, a patient is examined in a cylindrical gantry in a shield room in which an external radio frequency (RF) signal is shielded. In the gantry, a static magnetic field is formed by a main magnet 40 and a magnetic gradient field is formed by a gradient coil 30 that transmits a magnetic field gradient pulse. An RF coil 10 or a body coil 20 applies an RF excitation signal of a particular frequency to the patient to acquire a tomographic image of a particular part of the patient. An MR echo signal generated from the particular part of the patient due to a magnetic resonance phenomenon is received by the RF coil 10 and transferred to a central controlling unit 50 in an operating room separated from the shield room. The MR echo signal undergoes a signal processing process and then an MR image is acquired.

Recently, technology related to wireless communications between the RF coil 10 in the shield room and the central controlling unit 50 in the operating room has been studied. According to the technology, digital conversion of an MR echo signal is performed in the shield room so that noise due to an analog cable may be reduced. That is, decoupling of the RF coil 10 and receiving of an MR echo signal are wirelessly controlled in the central controlling unit 50. Amplification of an MR echo signal received by the RF coil 10 and demodulation of an amplified MR echo signal to a base band and conversion thereof to a digital signal are performed in the shield room. The digital signal is transmitted to the central controlling unit 50 through a wireless channel.

To smoothly perform wireless communications between the central controlling unit 50 and the RF coil 10, synchronization of clocks between the central controlling unit 50 and the RF coil 10 is first performed.

Figure 2:
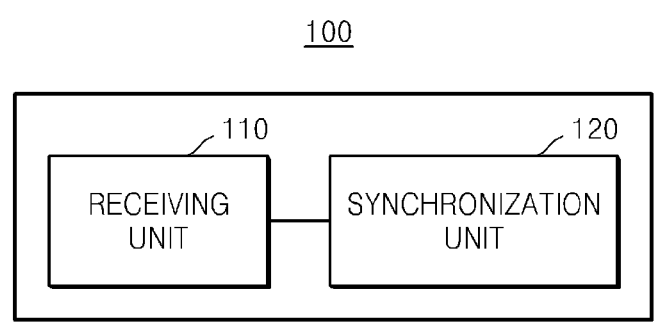
FIG. 2 is a block diagram schematically illustrating the structure of a synchronization apparatus according to an exemplary embodiment.

FIG. 2 is a block diagram schematically illustrating the structure of a synchronization apparatus 100 according to an exemplary embodiment. In the present exemplary embodiment, the synchronization apparatus 100 may be included in the RF coil 10, may be a separate apparatus connected to the RF coil 10, or may be embodied by a microchip.

Referring to FIG. 2, the synchronization apparatus 100 according to the present exemplary embodiment includes a receiving unit 110 and a synchronization unit 120. The receiving unit 110 receives a first clock from the central controlling unit 50. The receiving unit 110 may receive the first clock from the central controlling unit 50 through wireless communications. The first clock is a reference clock for synchronization of a second clock of the RF coil 10. The receiving unit 110 may include an antenna for receiving the first clock.

When the second clock is synchronized with the first clock, the receiving unit 110 stops receiving of the first clock from the central controlling unit 50. If the receiving unit 110 continues to receive the first clock even after the second clock is synchronized with the first clock, the first clock may have an influence on the RF excitation signal and the RF echo signal.

When the second clock is synchronized with the first clock, the central controlling unit 50 may stop transmission of the first clock to the RF coil 10 and the RF coil 10 may transmit a frame indicating completion of synchronization to the central controlling unit 50. Also, the receiving unit 110 may receive the first clock via the body coil 20 connected by wire to the central controlling unit 50.

In general, the RF coil 10 uses a high sensitivity coil and a high magnification amplifier to receive an MR echo signal of a very weak intensity. Since the intensity of the first clock received via the body coil 20 may be much stronger than the intensity of an MR echo signal, when the first clock is received by the RF coil 10, the RF coil 10 may be damaged.

Figure 3:
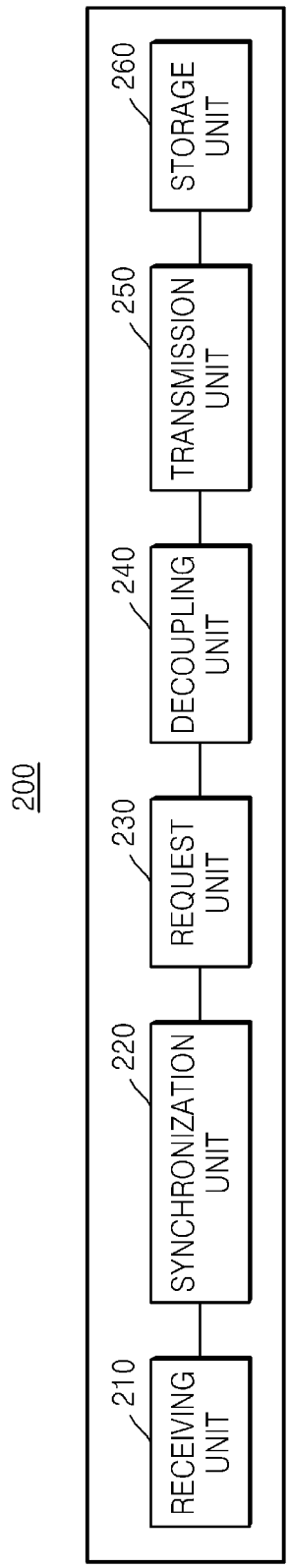
FIG. 3 is a block diagram schematically illustrating the structure of a synchronization apparatus according to another exemplary embodiment.

Accordingly, as illustrated in FIG. 3, a synchronization apparatus 200 according to another exemplary embodiment may further include a decoupling unit 240. The RF coil 10 is decoupled from the first clock by the decoupling unit 140 before the first clock is received from the central controlling unit 50.

The term "decoupling" signifies a general process of operating the RF coil 10 to prevent the RF coil 10 from being damaged by the RF excitation signal or the first clock. For example, while the RF excitation signal or the first clock is received, power to the RF coil 10 is cut off, or a receiving channel or a receiving frequency of the RF coil 10 is set to be quite different from that of the RF excitation signal or the first clock.

The synchronization unit 220 synchronizes the second clock of the RF coil 10 to the first clock that the receiving unit 210 receives. The synchronization unit 220 may match a frequency of the second clock with a frequency of the first clock. For example, the synchronization unit 220 may make the frequency of the second clock to be the same as that of the first clock or the frequency of the second clock to be a predetermined multiple of that of the first clock.

A method of synchronizing the second clock with the first clock is described below.

Referring to FIG. 3, the synchronization apparatus 200 may further include a request unit 230. When the second clock is synchronized with the first clock, the request unit 230 requests the central controlling unit 50 to stop transmission of the first clock. Alternatively, the request unit 230 may transmit a frame to request discontinuation of transmission of the first clock to the central controlling unit 50.

The request unit 230 may request the discontinuation of transmission of the first clock to the central controlling unit 50 before the MRI system generates an RF excitation signal.

In the MRI system, when the RF coil 10 continuously receives the first clock after the RF excitation signal is generated, the first clock may have an influence on the RF echo signal generated by the RF excitation signal.

As described above, in the MRI system, to acquire an image of a patient, the body coil 20 or the RF coil 10 transmits an RF excitation signal and the RF coil 10 receives an RF echo signal. When the first clock having a predetermined frequency is continuously transmitted to the RF coil 10 as an image of a patient is acquired, the first clock may have an influence on the RF excitation signal and the RF echo signal. Accordingly, noise may be generated in the image of a patient. That is, since the transmission of the first clock may deteriorate quality of the image of a patient, the request unit 130 requests the central controlling unit 50 to stop transmission of the first clock before the RF excitation signal is generated.

If the second clock is not yet synchronized with the first clock before the RF excitation signal is to be generated, the request unit 130 may request the central controlling unit 50 to delay generation of the RF excitation signal. When receiving a request for delaying the generation of the RF excitation signal, the central controlling unit 50 delays generation of the RF excitation signal by controlling the body coil 20 or the RF coil 10. This is because a quality image may be obtained by capturing an image after the first clock and the second clock are synchronized with each other.

Referring to FIG. 3, the synchronization apparatus 200 may further include a transmission unit 250 and a storage unit 260. When the second clock is synchronized with the first clock, the storage unit 260 stores the second clock that is synchronized. The stored second clock may be provided to the RF coil 10 by the transmission unit 250. The RF coil 10 may be operated based on the synchronized second clock.

Figure 4:
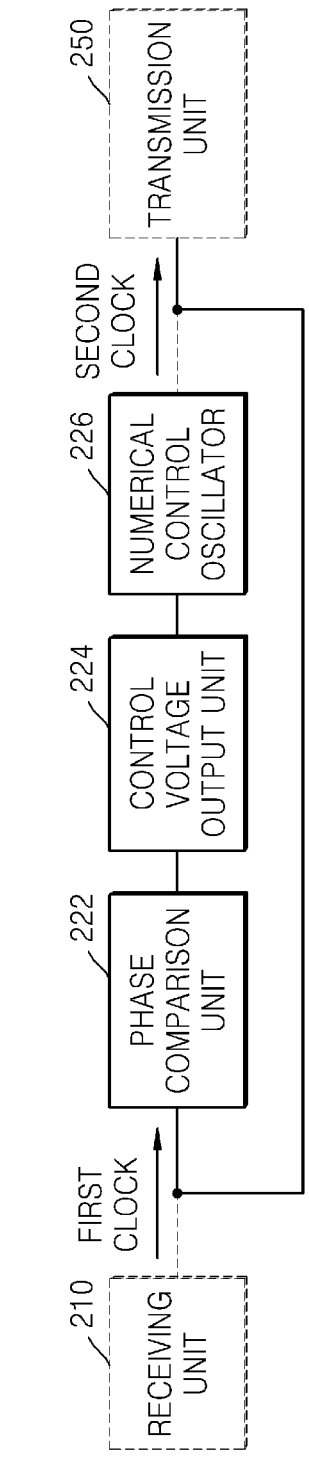
FIG. 4 is a block diagram schematically illustrating the structure of a synchronization unit in each of the synchronization apparatuses of FIGS. 2 and 3.

FIG. 4 is a block diagram schematically illustrating the structure of a synchronization unit 220 in each of the synchronization apparatuses 100 and 200 of FIGS. 2 and 3. Referring to FIG. 4, the synchronization unit 220 includes a phase comparison unit 222, a control voltage output unit 224, and a numerical control oscillator 226.

As illustrated in FIG. 4, the phase comparison unit 222 may receive the first clock through the receiving unit 210 and the synchronized second clock may be provided to the RF coil 10 via the transmission unit 150.

The phase comparison unit 222 obtains a phase difference between the first and second clocks. The phase comparison unit 222 may output a voltage or current corresponding to the phase difference between the first and second clocks. The phase comparison unit 222 may determine whether the first and second clocks are synchronized.

The control voltage output unit 224 outputs a control voltage to control an oscillation frequency of a clock based on the phase difference obtained by the phase comparison unit 222. The control voltage output unit 224 outputs a control voltage to reduce the phase difference between the first and second clocks.

The numerical control oscillator 226 varies the second clock based on the control voltage output by the control voltage output unit 224.

As illustrated in FIG. 4, a varied second clock is fed back to the phase comparison unit 222. Whether the second clock is synchronized is determined by obtaining the phase difference between the first and the varied second clocks.

Figure 5:
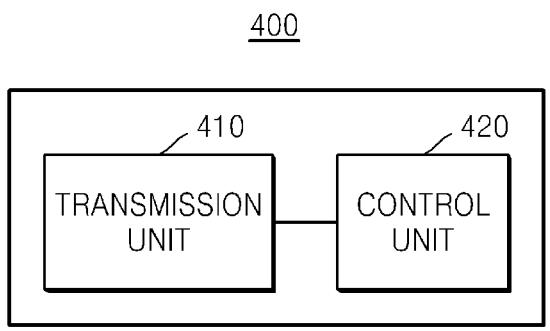
FIG. 5 is a block diagram schematically illustrating the structure of a synchronization apparatus according to another exemplary embodiment.

FIG. 5 is a block diagram schematically illustrating the structure of a synchronization apparatus 400 according to another exemplary embodiment. Referring to FIG. 5, the synchronization apparatus 400 according to the present exemplary embodiment includes a transmission unit 410 and a control unit 420. The synchronization apparatus 400 may be included in the central controlling unit 50 or may be an apparatus connected to the central controlling unit 50.

The transmission unit 410 transmits a reference clock to the RF coil 10. The RF coil 10 may synchronize the clock of the RF coil 10 based on the reference clock. The control unit 420 controls the transmission unit 420 to allow the reference clock to be transmitted before the RF excitation signal is generated in the MRI system.

If the transmission unit 420 continues to transmit the reference clock to the RF coil 10 during or after the generation of the RF excitation signal in the MRI system, the reference clock may have an influence on the RF excitation signal or the RF echo signal so that the quality of an image may be deteriorated.

Figure 6:
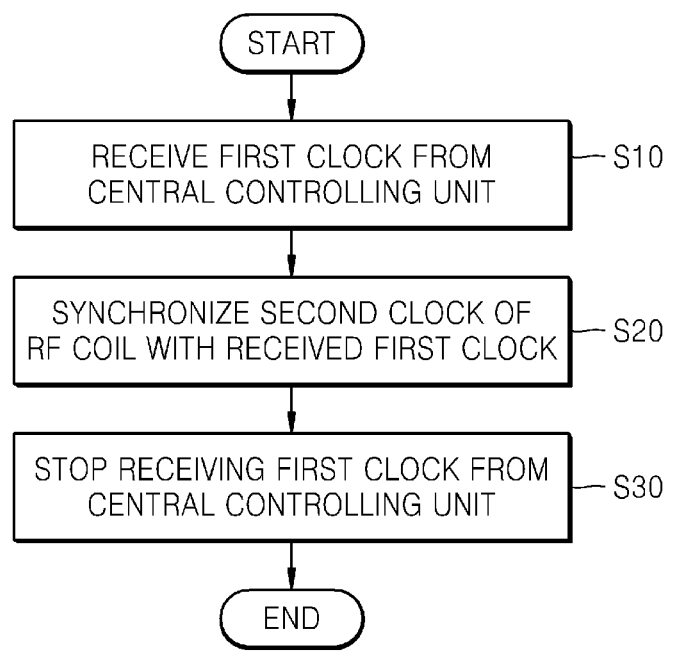
FIG. 6 is a flowchart for explaining a synchronization method according to an exemplary embodiment.

FIG. 6 is a flowchart for explaining a synchronization method according to an exemplary embodiment. Referring to FIG. 6, the synchronization method according to the present exemplary embodiment includes operations that are time serially processed by the synchronization apparatuses 100 and 200 of FIGS. 2 and 3. Accordingly, it can be seen that the above-described features of the synchronization apparatuses 100 and 200 of FIGS. 2 and 3 may be applied to the synchronization method of FIG. 6, even if they are omitted in the following description.

In S10, the receiving unit 210 receives the first clock from the central controlling unit 50. The receiving unit 210 may receive the first clock via the body coil 20 connected by wire to the central controlling unit 50. The receiving unit 210 decouples the RF coil 10 from the first clock before receiving the first clock, thereby preventing the RF coil 10 from being damaged by the first clock.

In S20, the synchronization unit 220 synchronizes the second clock of the RF coil 10 to the received first clock. The synchronization unit 220 may match the frequency of the second clock to that of the first clock. For example, the synchronization unit 220 may make the frequency of the second clock to be the same as that of the first clock or may synchronize the frequency of the second clock to be a predetermined multiple of that of the first clock.

In S30, when the second clock is synchronized with the first clock, the receiving unit 210 stops receiving the first clock from the central controlling unit 50. This is to prevent the RF excitation signal and the RF echo signal from being influenced by the first clock during capturing of an image by the MRI system. The request unit 230 may transmit a frame to request discontinuation of transmission of the first clock to the central controlling unit 50.

If the second clock is not yet synchronized with the first clock before the RF excitation signal is to be generated, the request unit 230 may request delaying the generation of the RF excitation signal to the central controlling unit 50. When the request to delay generation of the RF excitation signal is received, the central controlling unit 50 controls the body coil 20 or the RF coil 10 to delay the generation of the RF excitation signal. This is because a quality image may be obtained by capturing an image after the first clock and the second clock are synchronized with each other.

Figure 7:
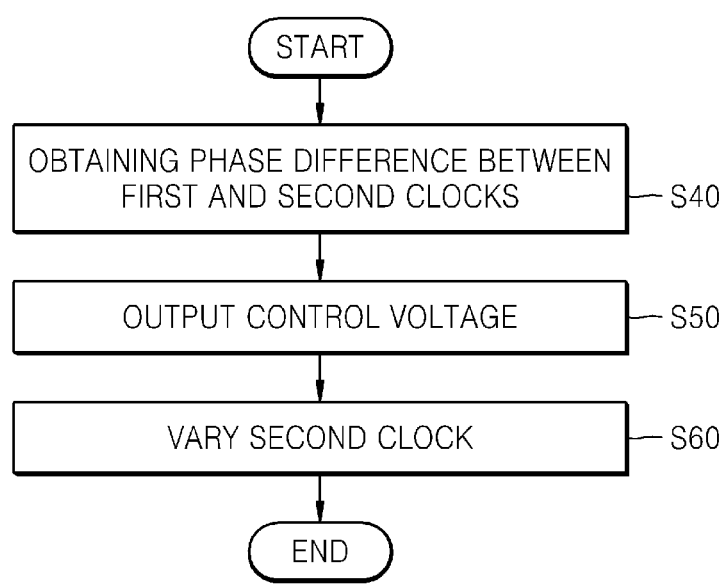
FIG. 7 is a flowchart for explaining a synchronization operation of a synchronization method according to another exemplary embodiment.

FIG. 7 is a flowchart for explaining a synchronization operation of a synchronization method according to another exemplary embodiment.

In S40, the phase comparison unit 222 obtains a phase difference between the first and second clocks. The phase comparison unit 222 may output a voltage or current corresponding to the phase difference between the first and second clocks or may determine whether the first and second clocks are synchronized with each other.

In S50, the control voltage output unit 224 outputs a control voltage for controlling an oscillation frequency of a clock based on the phase difference obtained by the phase comparison unit 222. The control voltage output unit 224 outputs a control voltage to reduce the phase difference between the first and second clocks.

In S60, the numerical control oscillator 226 varies the second clock according to the control voltage output by the control voltage output unit 224. The varied second clock is fed back to the phase comparison unit 222. The phase comparison unit 222 determines whether the second clock is synchronized, by obtaining the phase difference between the first and the varied second clocks.

As described above, in the synchronization apparatus and method according to the present invention, clocks between the central controlling apparatus and the RF coil may be synchronized.

Also, in the synchronization apparatus and method according to exemplary embodiments, clocks between the central controlling apparatus and the RF coil may be synchronized without influencing capturing of an image performed by the MRI system.

The exemplary embodiments can also be embodied as computer readable codes on a computer readable recording medium. The computer readable recording medium is any data storage device that can store data which can be thereafter read by a computer system. Examples of the computer readable recording medium include read-only memory (ROM), random-access memory (RAM), CD-ROMs, magnetic tapes, floppy disks, optical data storage devices, etc. The computer readable recording medium can also be distributed over network coupled computer systems so that the computer readable code is stored and executed in a distributed fashion.

While exemplary embodiments have been particularly shown and described, it will be understood by those of ordinary skill in the art that various changes in form and details may be made therein without departing from the spirit and scope of exemplary embodiments as defined by the appended claims.

What is claimed is:

1. A method of synchronizing clocks between a central controlling unit and a radio frequency (RF) coil which are wirelessly connected to each other in a magnetic resonance imaging (MRI) system, the method comprising:
    receiving a first clock from the central controlling unit;
    synchronizing a second clock of the RF coil with the received first clock based on a phase difference between the first clock and the second clock; and
    discontinuing the receiving of the first clock from the central controlling unit when the second clock is synchronized with the first clock,
    wherein the synchronizing comprises obtaining the phase difference between the first clock and the second clock.

2. The method of claim 1, further comprising requesting the central controlling unit to discontinue transmission of the first clock.

3. The method of claim 2, wherein the requesting to discontinue the transmission of the first clock is performed before an RF excitation signal is generated in the MRI system.

4. The method of claim 3, further comprising requesting the central controlling unit to delay generation of the RF excitation signal if the second clock is not synchronized with the first clock.

5. The method of claim 1, further comprising storing the second clock that is synchronized with the first clock.

6. The method of claim 1, wherein the receiving of the first clock from the central controlling unit comprises receiving the first clock via a body coil connected by wire to the central controlling unit.

7. The method of claim 6, wherein the receiving of the first clock from the central controlling unit comprises decoupling the RF coil from the first clock before the first clock is received.

8. The method of claim 1, further comprising providing the RF coil with the second clock synchronized with the first clock.

9. The method of claim 1, wherein the synchronizing of the second clock of the RF coil with the received first clock comprises matching a frequency of the second clock with a frequency of the first clock.

10. The method of claim 1, wherein the synchronizing of the second clock of the RF coil with the received first clock comprises:
    obtaining the phase difference between the first clock and second clock;
    outputting a control voltage to control an oscillation frequency of a clock based on the obtained phase difference; and varying the second clock according to the control voltage, wherein the second clock comprises a varied second clock that is fed back.

11. A non-transitory computer-readable recording medium having recorded thereon a program for executing the method of claim 1.

12. An apparatus for synchronizing clocks between a central controlling unit and a radio frequency (RF) coil which are wirelessly connected to each other in a magnetic resonance imaging (MRI) system, the apparatus comprising:
   a receiving unit which receives a first clock from the central controlling unit; and
   a synchronization unit which synchronizes a second clock of the RF coil with the received first clock based on a phase difference between the first clock and the second clock,
   wherein the receiving unit discontinues the receiving of the first clock from the central controlling unit when the second clock is synchronized with the first clock, and
   wherein the synchronization unit includes a phase comparator which obtains the phase difference between the first clock and the second clock.

13. The apparatus of claim 12, further comprising a request unit which requests the central controlling unit to discontinue transmission of the first clock.

14. The apparatus of claim 13, wherein the request unit requests the central controlling unit to discontinue transmission of the first clock before an RF excitation signal is generated in the MRI system.

15. The apparatus of claim 14, wherein the request unit requests the central controlling unit to delay generation of the RF excitation signal if the second clock is not synchronized with the first clock.

16. The apparatus of claim 12, further comprising a storage unit which stores the second clock that is synchronized with the first clock.

17. The apparatus of claim 12, wherein the receiving unit receives the first clock via a body coil connected by wire to the central controlling unit.

18. The apparatus of claim 17, wherein the synchronization unit further comprises a decoupling unit which decouples the RF coil from the first clock before the first clock is received.

19. The apparatus of claim 12, wherein the synchronization unit further comprises a transmission unit which provides the RF coil with the second clock that has been synchronized with the first clock.

20. The apparatus of claim 12, wherein the synchronization unit matches a frequency of the second clock to a frequency of the first clock.

21. The apparatus of claim 12, wherein the synchronization unit comprises:
   a phase comparison unit which obtains a phase difference between the first clock and the second clock;
   a control voltage output unit which outputs a control voltage to control an oscillation frequency of a clock based on the obtained phase difference; and
   a numerical control oscillator which varies the second clock according to the control voltage,
   wherein the varied second clock is fed back to the phase comparison unit.

22. A method of synchronizing clocks between a central controlling unit and a radio frequency (RF) coil which are wirelessly connected to each other in a magnetic resonance imaging (MRI) system, the method comprising:
   transmitting a first clock to the RF coil, using the central controlling unit;
   synchronizing a second clock of the RF coil with a received first clock based on a phase difference between the first clock and the second clock, using the RF coil; and
   discontinuing transmitting of the first clock, using the central controlling unit, when the second clock is synchronized with the first clock,
   wherein the synchronizing comprises obtaining the phase difference between the first clock and the second clock.

23. The method of claim 22, further comprising transmitting, by the RF coil, a frame indicating completion of synchronization, the frame being transmitted to the central controlling unit.

24. A radio frequency (RF) coil comprising an apparatus for synchronizing clocks between a central controlling unit and the radio frequency (RF) coil which are wirelessly connected to each other in a magnetic resonance imaging (MRI) system, said apparatus comprising:
   a receiving unit which receives a first clock from the central controlling unit; and
   a synchronization unit which synchronizes a second clock of the RF coil with the received first clock based on a phase difference between the first clock and the second clock,
   wherein the receiving unit discontinues the receiving of the first clock from the central controlling unit when the second clock is synchronized with the first clock, and
   wherein the synchronization unit includes a phase comparator which obtains the phase difference between the first clock and the second clock.

* * * * *